United States Patent [19]

Price et al.

[11] Patent Number: 5,800,859
[45] Date of Patent: Sep. 1, 1998

[54] COPPER COATING OF PRINTED CIRCUIT BOARDS

[76] Inventors: Andrew David Price, 36 St. James Ave., Surrey, England; Peter Thomas McGrath, 26693 Sotelo, Mission Viejo, Calif. 92692

[21] Appl. No.: 570,442

[22] Filed: Dec. 11, 1995

[30] Foreign Application Priority Data

Dec. 12, 1994 [GB] United Kingdom .............. 9425090

[51] Int. Cl.$^6$ ..................................................... B05D 5/12
[52] U.S. Cl. .................... 427/98; 106/14.05; 216/13; 252/79.2; 252/79.4; 427/123; 427/327
[58] Field of Search ........................ 106/14.05; 216/13; 252/79.2, 79.4; 427/98, 123, 327, 384

[56] References Cited

U.S. PATENT DOCUMENTS

| | | | |
|---|---|---|---|
| 3,556,883 | 1/1971 | Naito et al. | 252/79.4 |
| 3,668,131 | 6/1972 | Banush et al. | 252/79.4 |
| 3,756,957 | 9/1973 | Shiga | 252/79.4 |
| 3,773,577 | 11/1973 | Shibasaki et al. | 252/79.4 |
| 3,801,512 | 4/1974 | Solenberger | 252/186 |
| 3,948,703 | 4/1976 | Kushibe | 252/79.4 |
| 4,051,057 | 9/1977 | Ericson | 252/100 |
| 4,130,454 | 12/1978 | Dutkewych et al. | 156/659 |
| 4,144,119 | 3/1979 | Dutkewych et al. | 156/659 |
| 4,437,931 | 3/1984 | Elias et al. | 156/666 |
| 4,557,898 | 12/1985 | Greene et al. | 424/616 X |
| 4,770,808 | 9/1988 | McDonogh et al. | 252/186.29 |
| 4,849,124 | 7/1989 | Backus | 252/79.4 |
| 4,859,281 | 8/1989 | Goltz | 156/666 |
| 4,956,035 | 9/1990 | Sedlak | 156/664 |
| 4,973,380 | 11/1990 | Pryor et al. | 156/642 |
| 5,376,387 | 12/1994 | Monticello | 424/616 |

FOREIGN PATENT DOCUMENTS

| | | |
|---|---|---|
| 1250406 | 2/1989 | Canada . |
| 0670379A1 | 9/1995 | European Pat. Off. . |
| H51-27819 | of 0000 | Japan . |
| H1-240683 | 9/1989 | Japan . |
| H3-79778 | 4/1991 | Japan . |
| H3-79788 | 4/1991 | Japan . |
| H3-140481 | 6/1991 | Japan . |
| H3-140482 | 6/1991 | Japan . |
| H3-140483 | 6/1991 | Japan . |
| H3-140484 | 6/1991 | Japan . |
| H3-285393 | 12/1991 | Japan . |
| H6-112646 | 4/1994 | Japan . |
| 2106086 | 4/1983 | United Kingdom . |
| 2203387 | 10/1988 | United Kingdom . |

*Primary Examiner*—Michael Lusignan
*Attorney, Agent, or Firm*—Mintz, Levin, Cohn, Ferris, Glovsky and Popeo, P.C.

[57] ABSTRACT

A process for copper coating printed circuit boards is disclosed. The process includes a treating step in which a metal surface is contacted with an adhesion promotion composition material. The adhesion promotion material includes 0.1 to 20% by weight hydrogen peroxide, an inorganic acid, an organic corrosion inhibitor and a surfactant.

32 Claims, 2 Drawing Sheets

COPPER COATING OF PRINTED CIRCUIT BOARDS

FIELD OF THE INVENTION

In the production of a printed circuit board (PCB), in a first (multi-step) stage, a "bare board" is prepared and in a second (multi-step) stage, various components are mounted on the board. The present invention relates to the first stage in which the bare board is manufactured and to the provision of an adhesion promotion step to improve adhesion within a multi-layer board.

PRIOR ART

A multi-layer board comprises at least one insulating layer and at least one conducting layer which comprises a conducting circuit pattern. The conducting layer is therefore, generally, a discontinuous sublayer in the form of a circuit pattern. The board may also comprise conductive pads and/or through-holes. The conducting layer pattern and the conductive pads and/or through holes are generally formed from copper. The insulating layers are generally formed from fibreglass bonded with epoxy-based resin.

Generally, a bare board is formed from an inner-layer and at least one outer-layer. The expression inner-layer as used in the PCB industry generally refers to a composite of at least two layers (comprising an insulating layer and a conducting layer), or more usually, three layers: a central insulating layer, and on either side, a copper conducting layer. The outer-layer which may be a pre-preg may be a single insulating layer. Alternatively, it may comprise both an insulating layer and a conducting layer.

During the manufacture of a PCB, at least one outer-layer is adhered to the conducting layer of the inner-layer so that an insulating layer of the outer-layer is innermost, contacting the conducting layer of the inner-layer.

Preferably, a multi-layer board will be formed from at least one inner-layer and at least two outer-layers, one outer-layer to be adhered to each conducting layer of the inner-layer.

It has been found that in trying to permanently bond a copper conducting layer and an insulating layer to one another, it is difficult to provide a sufficiently strong bond. If a weak bond is formed, during the second manufacturing stage where components are mounted on the board, or later during use, delamination of the board may occur. In particular, the copper surface tends to oxidize on exposure to the atmosphere to form a tarnished layer on its surface. If an insulating layer is adhered directly to this tarnished layer, the bond will be weak and will eventually fail. Many methods of overcoming this problem have been proposed, the most commonly used method is to remove the tarnished layer and to form a strongly adherent copper oxide layer, known as black or brown oxide.

In order to form a black or brown oxide layer on a copper surface as preparation for adhesion, the copper surface generally undergoes, in sequence: a cleaning step, a rinsing step, a caustic pre-rinse and an oxide processing step. In the oxide processing step, the temperature is generally no less than 50° C. and the contact time with an oxidizing solution is from 5 to 7 minutes. This contact time and relatively high processing temperature are disadvantageous as the high energy requirement and time period required increase processing costs. In addition, there are an undesirably high number of process steps.

However, the black or brown oxide layer adheres well to the copper and also forms a surface having good surface roughness so that adhesion to the neighboring insulating layer is effective.

It would be desirable to form a surface which provides good adhesion to the copper and good surface roughness to provide adhesion to the neighboring insulating layer (or other organic coating layer), using a simplified process and preferably also which does not require such high temperatures or such long processing times.

Metal treatment involving the use of acidic peroxide solutions is known. For example in CA-A-1250406, metals such as iron, copper or their alloys are treated using a solution comprising hydrogen peroxide for metal pickling or polishing. The hydrogen peroxide solution is stabilized using a block of a solid stabilized and optionally in addition a corrosion inhibitor such as benzotriazole and anionic or nonionic surfactant.

Because hydrogen peroxide decomposition is a problem, many hydrogen peroxide-based compositions have been developed, each comprising a different type of stabilizer system.

Cleaning or polishing compositions based on hydrogen peroxide are described for example in U.S. Pat. No. 3,556,883 discloses compositions comprising hydrogen peroxide, sulphuric acid and alcohol stabilizers for cleaning of for example, metal wires. other similar cleaning compositions are described in U.S. Pat. No. 3,756,957 where a stabilizer for the hydrogen peroxide is selected from the group of aliphatic amines and their salts, alkoxy amines, aliphatic acid amines and aliphatic amines.

For use in the PCB industry, such compositions are known and have been described as etchant compositions to be used in the etching step for forming the copper circuit pattern: a layer of conductive foil, generally copper foil mounted on an insulating layer is partially protected in a pattern which corresponds to the final desired circuit pattern. The foil is then contacted with an etching solution and the areas of foil which are unprotected are etched away, leaving the desired circuit patterns. In etching processes, the metal foil which is contacted with the hydrogen peroxide-based composition is etched away for complete removal. This type of etchant composition and process is described for example in U.S. Pat. No. 4,144,119, U.S. Pat. No. 4,437,931, U.S. Pat. No. 3,666,131, U.S. Pat. No. 4,849,124, U.S. Pat. No. 4,130,454, U.S. Pat. No. 4,859,281 and U.S. Pat. No. 3,773,577. In the latter two references, the etching composition also comprises a triazole to increase the rate of metal dissolution achieved by the etching composition.

In GB-A-2203387 a copper etching process is described with an etch bath regeneration step. A hydrogen peroxide etching composition comprising stabilizers including wetting agent is disclosed for cleaning copper surfaces of a PCB prior to electroplating an additional, thickening copper layer onto the conducting layer which is formed from copper. After the electroplating step a photo resist or screen resist is applied.

In U.S. Pat. No. 4,051,057 (and DE-A-2555809) a bright dip composition for polishing/pickling metal surfaces, for instance of copper, comprises sulphuric acid, hydrogen peroxide, a hydroxy such as citric acid, a triazole and/or a tertiary fatty amine. The final product should not have "pittings". The incorporation of surfactant is said to increase the rate of etching/removal of oxide from the surface, while the incorporation of benzotriazole is said to improve the "leveling effect".

In U.S. Pat. No. 3,948,703 chemical copper polishing compositions are described containing hydrogen peroxide, an acid and an azole compound. The compositions may also contain a surfactant and nonionic surfactants are used in the worked examples.

In U.S. Pat. No. 4,956,035 chemical polishing compositions for metal surfaces comprise an etching composition, such as ferric chloride or peroxy sulphuric acid with a quaternary ammonium cationic surfactant and a secondary surfactant.

In GB-A-2106086 hydrogen peroxide acid compositions are used to etch, chemically mill or bright dip copper surfaces. The compositions contain triazole compounds to stabilize then against decomposition by heavy metal ions.

In JP-A-06-112646 a copper surface is roughened to improve adhesion in laminates in the production of multi-layer PCBs. The roughening is carried out by a two-step process, each step involving treatment with a hydrogen peroxide/sulphuric acid composition. Both compositions must be free of corrosion inhibitor.

In JP-A-03-140481 to 140484 copper surfaces are pre-treated prior to lamination with a hydrogen peroxygen/sulphuric acid composition to form a roughened surface. In '484 the composition contains an additive (CB-896), manufactured by the Mekki Co., which is said to accelerate the process and inhibit decomposition of peroxide.

In U.S. Pat. No. 3,773,577 a copper etchant based on sulphuric acid and hydrogen peroxide contains an aliphatic amine, examples being primary or tertiary amines. The amines are not surface active. In JP-A-03-79778 a copper etchant based on sulphuric acid and hydrogen peroxide contains a triazole and chloride ion together with an alcohol or glycol. In JP-A-51-27819 a copper etchant based on hydrogen peroxide and sulphuric acid contains a tetrazole and optionally a tertiary amine or an alcohol.

SUMMARY OF THE INVENTION

The present inventors have surprisingly found that the use of a hydrogen peroxide-containing aqueous composition on a copper surface forms a cleaned copper surface which is microroughened and has sufficiently good porosity that a particularly strong bond may be formed with an organic layer, as is required in the preparation of multi-layer PCBs.

In accordance with the present invention, there is provided a process for treating a metal surface comprising contacting the conducting layer of the surface with an adhesion promotion composition comprising 0.1 to 20% by weight hydrogen peroxide, an inorganic acid, an organic corrosion inhibitor and a surfactant in an adhesion promotion step to form a microroughened conversion-coated surface.

The process of the invention is particularly useful for forming a multi-layer PCB comprising an inner-layer and an outer-layer, the inner-layer comprising at least one insulating layer and at least one conducting layer and the outer-layer comprising at least an insulating layer, in which the conducting layer is the metal whose surface is treated in the invention. After the adhesion promotion step a polymeric material is preferably adhered directly to the conducting layer of the inner-layer. The polymeric material may be the insulating layer of the outer-layer or for direct adhesion to the insulating layer of the outer-layer.

The process of the invention may also be used to provide a roughened surface to which polymeric materials such as photo imageable resins, solder masks, adhesives or polymeric etch resists have improved adhesion, usually in the manufacture of PCBs.

The process is particularly suitable where the metal is copper or a copper alloy. The process is hereinafter described by reference to the application to copper surfaces but it is to be understood that it can also be used for other metals. The process of the present invention has been found to be particularly advantageous as it overcomes the need for forming a black or brown copper oxide layer, as in the prior art processes. As explained above, the conducting layers of the inner-layer and/or outer-layer (which is optionally clad on the one side with the conducting layer) generally comprises copper or a copper alloy.

DESCRIPTION OF THE PREFERRED EMBODIMENTS

Figure 1:
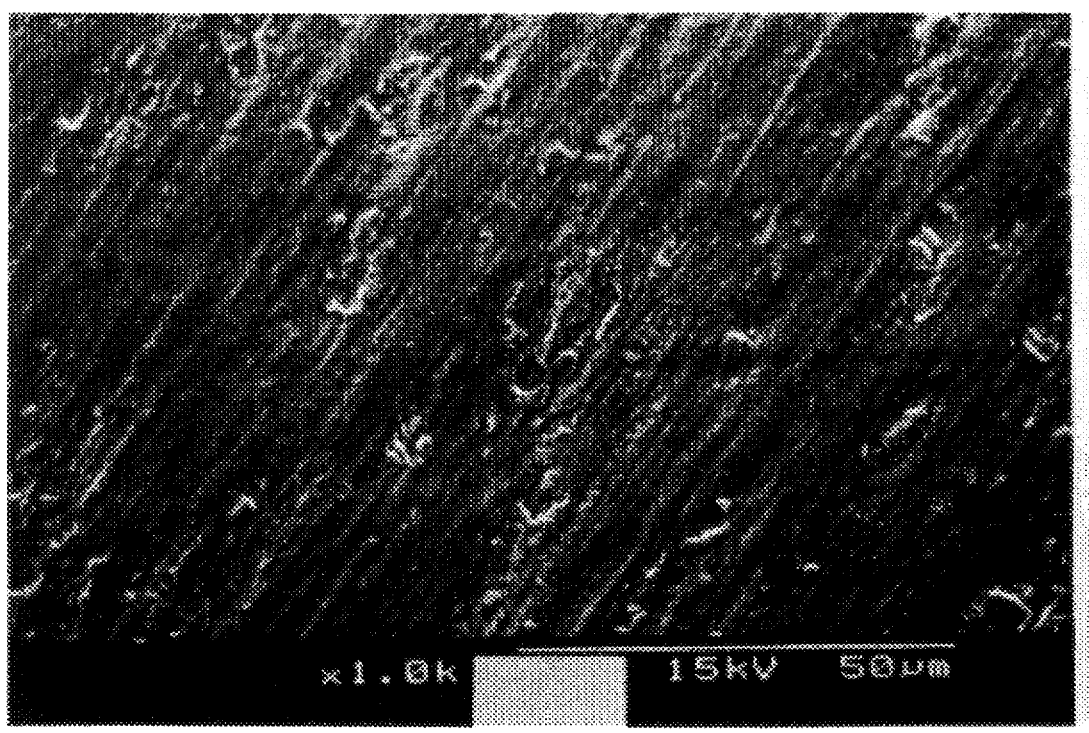
FIG. 1 illustrates a surface on copper foil without the adhesion promotor treatment of the present invention.

The adhesion promotion composition is an aqueous composition which comprises hydrogen peroxide, an inorganic acid, one or more corrosion inhibitors, preferably selected from triazoles, tetrazoles and imidazoles and a surfactant, preferably a cationic surfactant.

The adhesion promotion composition has been found to form a roughened conversion coated surface. From atomic surface analysis, this surface is believed to comprise a complex of copper with the corrosion inhibitor on the conducting layer providing greater surface area so that good adhesion with the neighboring organic coating can be formed.

Hydrogen peroxide is present in the adhesion promotion composition at a concentration of at least 0.01% by weight active hydrogen peroxide and preferably at least 1.0% by weight hydrogen peroxide. The concentration of hydrogen peroxide is no greater than 20%, preferably no greater than 10%, more preferably no greater than 5% by weight, most preferably no greater than 4% by weight. It has been found that when the concentration of hydrogen peroxide in the adhesion promotion composition is too high the structure of the roughened surface of the conducting layer forms a somewhat coral-like structure which is more fragile than the desired roughening effect, so that it forms a weaker bond than when lower concentrations of hydrogen peroxide are used. The most preferred concentration of hydrogen peroxide is from 0.5% by weight of the adhesion promotion composition to 4% by weight.

The inorganic acid in the adhesion promotion composition is preferably provided by phosphoric acid, nitric acid, sulphuric acid, or mixtures thereof. Sulphuric acid is particularly preferred. The concentration of acid in the composition is generally at least 1%, preferably at least 8% and most preferably at least 9% by weight of the composition. Generally the concentration of acid in the composition will be no greater than 50%, preferably no greater than 30% and most preferably no greater than 20% by weight of the total composition.

The corrosion inhibitor is usually selected from one or mixtures of more than one triazole, tetrazole and imidazole. Triazoles are particularly preferred and optionally substituted benzotriazoles are most preferred. Suitable substituents are for example $C_{1-4}$ alkyl substituents.

The corrosion inhibitor is preferably present in the adhesion promotion composition in an amount of at least 0.0001% by weight, preferably at least 0.0005%. Particularly desirable results are achieved with concentrations of at least 0.1%, more preferably more than 0.5% by weight and something more than 1% by weight. Generally, the corrosion inhibitor will be present in the composition in an amount no greater than 20% by weight and preferably no greater than 10% and more preferably less than 5% by weight of the total weight of the adhesion promotion composition. High concentrations, such as more than 5% can be desirable as they can allow a reduction in the processing time. Preferably, however, the concentration is less than 5% or even less than 1%.

The surfactant is preferably a cationic surfactant, usually an amine surfactant. Most preferably it is a quaternary ammonium surfactant which is preferably one or more ethoxylated fatty amines. Preferably the surfactant will be a $C_{10-40}$ surfactant, that is a surfactant comprising at least one (preferably one) $C_{10-20}$ alkyl group. Suitable surfactants have at least one, preferably two, hydroxy lower alkyl groups, that is $C_{1-4}$ hydroxyalkyl, and one or, less preferably, two lower alkyl, that is, $C_{1-4}$ alkyl groups, attached to the nitrogen atom. Particularly preferred quaternary ammonium surfactants are isodecyloxypropyl dihydroxyethyl methyl ammonium chloride and isotridecyloxypropyl dihydroxyethyl methyl ammonium chloride.

Generally the surfactant will be present in the composition in an amount of at least 0.001% by weight, preferably at least 0.005% by weight or even 0.01% by weight. Generally, the surfactant will be present in the adhesion promotion composition in amounts no greater than 5%, preferably no greater than 3% and preferably no greater than 2.5% by weight. It has been found that if the concentration of the surfactant is increased significantly above 5%, the microroughened surface of the metal which forms the good adhesion promotion lacks uniformity so that good adhesion may not be provided over the entire surface of the conducting layer.

Preferably, the weight percentage of surfactant in the adhesion promotion composition will be below the weight percentage corrosion inhibitor in the composition.

Other optional components may be incorporated in the composition. A preferred additional component comprises stabilizing agent for the hydrogen peroxide. Suitable stabilizing agents may be those mentioned in the patents above. Examples include dipicolinic acid, diglycolic and thiodiglycolic acid, ethylene diamine tetra-acetic acid and its derivatives, magnesium salt of an aminopolycarboxylic acid, sodium silicate, phosphates, phosphonates and sulphonates.

When the composition includes a stabilizing agent, preferably the stabilizing agent is present in an amount of from 0.001% or even at least 0.005% by weight of the adhesion promotion composition. Generally there will be no more than 5% by weight, preferably no more than 1% by weight in the composition.

The adhesion promotion composition may be made up by mixing the components in an aqueous solution, preferably formed using deionized water. In accordance with standard safe practice, hydrogen peroxide will be added to the composition in a diluted form. The components forming the adhesion promotion composition will be mixed as required.

The copper surface is contacted with the adhesion promotion composition generally without any pre-treatment. The copper surface may have previously been provided with a tarnish-inhibiting coating, e.g. by incorporating the tarnish inhibitor into a resist stripping composition used in an immediately preceding step of etch resist stripping. Tarnish inhibitors used in such strippers are, for example, a triazole or other coating. If so, it may be desirable to pre-clean the copper surface with an acidic pre-cleaner such as PC 7078 or PC 7087 (trademarks for products of Alpha Metals Limited of the United Kingdom), before contact with the composition. Preferably prior to contact with the adhesion promotion composition, the copper surface will be substantially dry. Apart from such a cleaning step, it is generally unnecessary to carry out any pretreating steps. In a preferred embodiment of the invention, the adhesion promotion step follows immediately after an etch resist stripping step or there is a single precleaning step between the etch resist stripping step and the adhesion promotion step.

Contact with the adhesion promotion composition may be by any conventional means, for example by immersion in a bath of the adhesion promotion composition or by spraying or any other means of contact. Contact may be as part of a continuous process.

Generally contact of the copper surface with the adhesion promotion composition will be at a temperature no greater than 75° C., most preferably the temperature will be less than 50° C., for instance at ambient temperatures, for example from 10° to 35° C., usually above 15° C., most preferably from 20° to 30° C. The contact time will generally be no less than 1 second, preferably no less than 5 seconds and often at least 10 seconds, most preferably at least 30 seconds. The maximum contact time may be up to 10 minutes, although preferably the contact time is no greater than 5 minutes, most preferably no greater than 2 minutes. A contact time of about 1 minute or less than 1 minute is particularly preferred. It is surprising that the compositions can provide desirable results with such short processing times, that is, with contact time of less than 2 minutes.

If the contact time of the adhesion promotion composition with the copper surface is too long, there is a risk that the copper surface may be etched away due to dissolution and/or that a deposit other than the microporous crystalline deposit which forms the microroughened surface will be deposited onto the surface of the conducting material.

The process has been found to be particularly advantageous because it can be used to replace the black copper oxide adhesion promotion step in a considerably reduced number of steps. The microroughened surface which is formed provides good adhesion to an adjacent polymeric coating, for example an epoxy bonded fiber glass resin of a neighboring insulating layer, or a resist material. The invention is particularly useful when used in combination with a bonding resist, for example as described in PCT/GB94/02258.

The invention has also been found to be particularly useful when the copper foil which is treated is a foil produced in a drum side treatment process to form a drum side treated foil, which provides a copper foil in which the smooth, drum side is provided with an adhesion enhancing plating and the other side is rough. Either or both sides may be treated in the method, but preferably the drum side, at least, is treated. The drum side treated foil may be made as described in WO-A-9421097 publication, the text of which is incorporated herein by reference. The method described in the present application is therefore used in addition to the adhesion promoting step described in that specification. Drum side treated foil is commercially available (and is known as DSTFoil™) from Polyclad Laminates, Inc. of West Franklin, N.H. The foil is thus provided at least on its drum side with an adhesion enhancing plating, preferably of copper-zinc particles, as described in the referenced WO-A-9421097 publication. The foil has been electrodeposited onto a smooth surface and preferably has a nominal conductive thickness in the range 2.5 to 500 μm. The rough (or matte) side which is not coated with an adhesion enhancing plating way have a roughness $R_z$ value of less than 10.2 μm, i.e. the foil is a low profile foil, or less than 5.1 μm (i.e. a very low profile foil) or it may be a standard foil (that is, any roughness value).

After contact of the copper surface with the adhesion promotion composition to form the microroughened surface, generally a pre-preg layer may be placed directly adjacent to the copper surface and the pre-preg layer adhered directly to the copper surface in the adhesion step, forming a multi-layer PCB. Generally in the adhesion step heat is applied to initiate the adhesion reaction. In the adhesion step, mechanical bonding is due to penetration of the polymeric material of the insulating layer into the microroughened surface provided in the adhesion promotion step. As an alternative to the pre-preg layer, the polymeric material applied directly on top of the microroughened surface produced in the adhesion promotion step a polymeric photo-resist, screen-resist solder mask or adhesive material may be directly applied.

As mentioned above, the present invention avoids the use of multi-step microetch processes which require additional steps between a microetch step and the subsequent PCB manufacturing steps between a microetch step and the subsequent PCB manufacturing step in which a polymeric layer is applied to the copper, including alkali dips, oxide and reducer steps. Although it may be desirable to follow the adhesion promotion step with a rinse step, it is often adequate to rinse just with water. The treated surface is optionally subsequently dried. According to a preferred embodiment of the process a polymeric material is subsequently adhered to the microroughened surface with no intermediate steps between the adhesion promotion step and the adhesion of the polymeric material, or with a single rinse and/or drying step.

Preferably a pre-preg insulating layer may be applied directly to the microroughened surface and in the adhesion step, pressure is also applied by placing the layers which are to form the multi-layer laminate of the PCB of at least the inner-layer and outer-layer, in a press. Where pressure is applied it is generally from 100 to 400 psi, preferably from 150 to 300 psi. The temperature of this adhesion step will generally be from 100° C., preferably from 120° C. to 200° C. The adhesion step is generally carried out for any period from 5 minutes to 3 hours, most usually from 20 minutes to 1 hour, but is for sufficient time and pressure and at a sufficiently high temperature to ensure good adhesion between the first and second layers. During this adhesion step, the polymeric material of the insulating layers which is generally an epoxy resin, tends to flow ensuring that the conductive pattern in the metal is substantially sealed between insulating layers and subsequent penetration of water and air is avoided.

If desired, several layers may be placed together in the adhesion step to effect lamination of several layers in a single step to form the multi-layered board. As will be seen, the present invention provides a considerably simplified process over the known processes and provides a conducting surface formed from copper or other metals which has good adhesion.

The present invention also includes an adhesion promotion composition comprising 0.1% to 20% by weight hydrogen peroxide, an inorganic acid, 0.5% to 2.5% by weight of an organic corrosion inhibitor preferably comprising triazole, tetrazole and/or imidazole and a cationic surfactant. In a particularly preferred composition, the composition also comprises a stabilizing agent for hydrogen peroxide selected from those mentioned above.

Examples of the invention are given below:

EXAMPLES 1–8

Adhesion promotion compositions 1–8 were made up by mixing the components in the various weight percentages given in Table 1 to form aqueous compositions.

Figure 2:
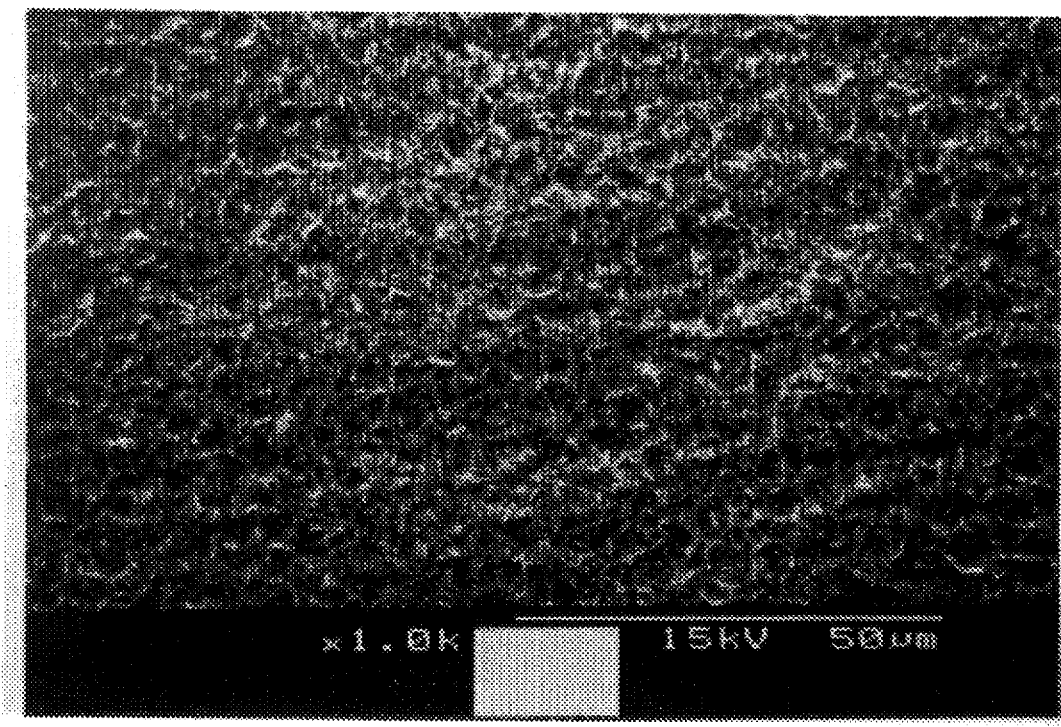
FIG. 2 illustrates the results obtained by treating copper foil with chemical microetch cleaners.
Figure 3:
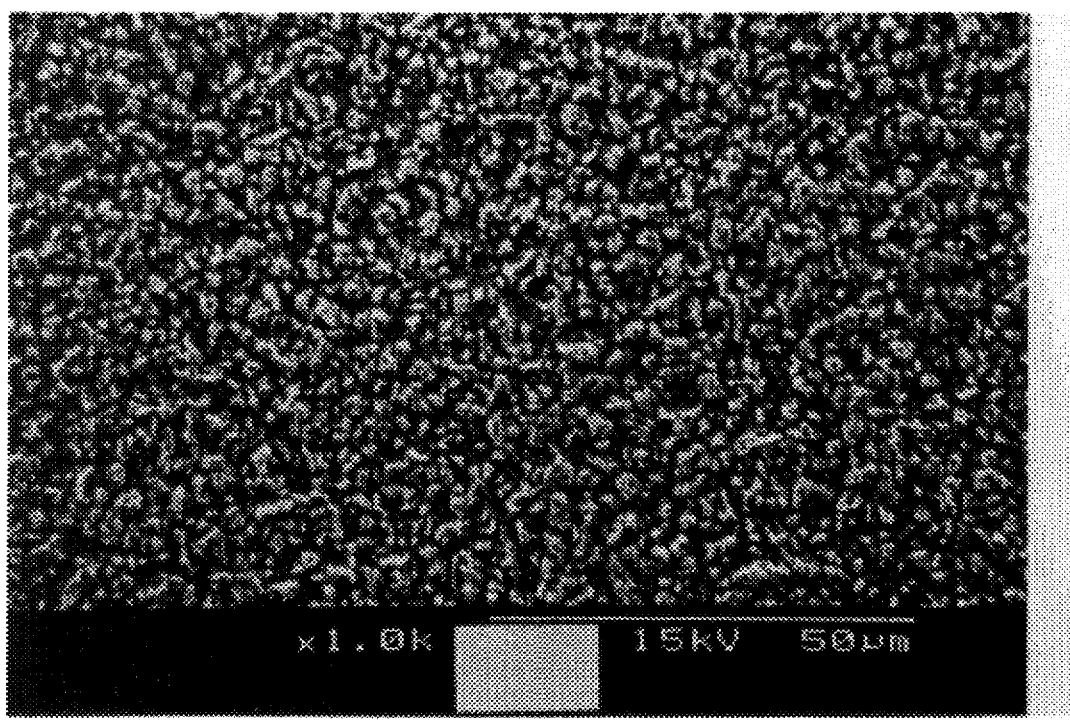
FIG. 3 illustrates the results obtained from treating copper foil according to the present invention.

FIG. 1 shows the type of surface resulting on copper foil without an adhesion promotion treatment. FIG. 2 shows the results obtained using a chemical cleaner as discussed above. FIG. 3 illustrates the results obtained after treating copper foil in accordance with the present invention.

Standard copper foil has a smooth surface topography (FIG. 1). The use of chemical microetch cleaners based upon sodium persulphate or ferric chloride chemically modifies the surface. The etching component does not dissolve the surface in a uniform manner, and the surface roughness is increased (FIG. 2). The mechanism of the process described in the present invention is quite different. In this case copper is dissolved at the surface; this copper reacts with the inhibitor components to produce a film on the surface. This film is believed to be crystalline in nature because of its repeating structure. The color of the film is red brown, and often shows the distinctive "cracked-mud" appearance under magnification (FIG. 3). It is this unusual surface structure that is believed to be the key to the excellent adhesion obtained with polymeric materials. They are able to flow into the fissures of the surface giving a good grip or bond.

The microroughened surface of the copper foil treated according to the invention is clear from Table 1 and FIGS. 1–3.

TABLE 1

| Component | Weight % | | | | | | | |
| --- | --- | --- | --- | --- | --- | --- | --- | --- |
| | Example 1 | Example 2 | Example 3 | Example 4 | Example 5 | Example 6 | Example 7 | Example 8 |
| Hydrogen Peroxide | 3.5 | 3.5 | 3.5 | 3.5 | 3.5 | 3.5 | 3.5 | 3.5 |
| Sulphuric Acid | 15 | 8.5 | — | — | 8.5 | — | 8.5 | 8.5 |
| Nitric Acid | — | — | 9.5 | — | — | — | — | — |
| Phosphoric Acid | — | — | — | 7.4 | — | 14.8 | — | — |
| Benzotriazole | 0.68 | 0.68 | 0.68 | 0.68 | 0.68 | 0.68 | 0.68 | 0.68 |
| *Tomah Q 14-2 | 0.01 | 0.01 | 0.01 | 0.01 | — | 0.01 | — | 0.02 |

TABLE 1-continued

| Component | Weight % | | | | | | | |
|---|---|---|---|---|---|---|---|---|
| | Example 1 | Example 2 | Example 3 | Example 4 | Example 5 | Example 6 | Example 7 | Example 8 |
| *Tomah Q 17-2 | — | — | — | — | — | — | 0.01 | — |
| *Tomah E14-2 | — | — | — | — | 0.01 | — | — | — |
| Deionised Water | to 100 | to 100 | to 100 | to 100 | to 100 | to 100 | to 100 | to 100 |

*Trade name of Exxon Chemicals

EXAMPLE 9

The solution in example 1 was used to treat copperclad PCB inner-layer panels. The solution was used at about 45° C. with a contact time of 60 seconds. Half of the panels were clad in Polyclad DSTFoil™ referred to above. The other half were clad with standard copper foil. After processing, it was immediately noted that the DSTFoil™ samples had a much darker red-brown coloration than those with standard copper foil. The inner layers were then pressed into 4 layer PCBs following normal procedures. The PCBs were finished, and then tested for "pink-ring" and delamination following industry standard tests IPC-TM-650 & MIL-P-55110D respectively. All of the panels passed these tests.

In a further test, standard copper foil & DSTFoil™ samples were treated with the solution in Example 1. These foils were than laminated to prepreg material for the purpose of testing peel strengths in accordance with MIL-P13949. Mean peel test values for the standard foil were in the range 5.5–6.5 pounds per inch, those for the DSTFoil™ were in the range of 6.5–7.5 pounds per inch. Both foils showed performance equal or better than the generally accepted requirement of 5–6 pounds per inch. (Achieved using conventional alkaline black oxide processes as the copper treatment.)

EXAMPLE 10

Samples of typical simple single-sided PCBs were obtained before the application of solder resist. One example was passed through a mechanical brushing machine, the other was treated with the solution in Example 1. Both PCBs were then coated with a UV curing solder resist (supplied by Alpha Metals) using a screen printing technique. After the solder resist had been UV cured, adhesion of the resist was tested by immersing the samples which had been brushed showed extensive blistering of the solder resist. The sample treated with this invention showed no blistering up to the point when the test was terminated, at which point thermal degradation of the PCB substrate had occurred.

In a further test, the above was repeated using a photo-imageable dry-film soldermask from the Dupont company. In this case a similar improvement in adhesion was noted. It was also noted that the use of this pretreatment to enhance adhesion did not interfere with the clean development of the solder resist after imaging. This problem known as "resist lock-in" has been encountered with other adhesion promoting processes.

What is claimed is:

1. A process for treating a metal surface to promote adhesion thereto, comprising contacting the metal surface with an adhesion promotion composition comprising 0.1 to 20% by weight hydrogen peroxide, an inorganic acid, an organic corrosion inhibitor and a surfactant to form a microroughened conversion-coated surface, and adhering a material to the microroughened conversion-coated surface.

2. A process according to claim 1 in which the metal is selected from the group consisting of copper and copper alloys.

3. A process according to claim 1 or claim 2 in which hydrogen peroxide is present in the adhesion promotion composition at a concentration of 1.0% to 4.0% by weight.

4. A process according to claim 1 in which the inorganic acid is selected from the group consisting of phosphoric acid, nitric acid, sulphuric acid, or mixtures thereof.

5. A process according to claim 1 in which the concentration of acid in the composition is in the range of 1 to 50%.

6. A process according to claim 1 in which the corrosion inhibitor is selected from the group consisting of a triazole, tetrazole, and imidazole.

7. A process according to claim 1 in which the corrosion inhibitor is present in the adhesion promotion composition in an amount of at least 0.0001% by weight and no greater than 20% by weight of the total weight of the adhesion promotion composition.

8. A process according to claim 1 in which the surfactant is a cationic surfactant.

9. The process of claim 1 in the which the metal surface is a metal foil which comprises a portion of a laminate for use in forming a printed circuit board, the laminate comprising an electrically insulative substrate having a first substrate side adhered to a first relatively smooth side of the metal foil which, prior to adhering to the substrate, has been microroughened and a second relatively rough side which has not been microroughened, wherein, following adhering the first side of the foil to the substrate, the second side of the foil is treated in accordance with the process of claim 1 to form a microroughened conversion-coated surface.

10. A process according to claim 1 in which the surfactant is present in the composition in an amount of at least 0.1% by weight and no greater than 5% by weight.

11. A process according to claim 1 in which the metal surface is contacted with the adhesion promotion composition without any pretreatment.

12. A process according to claim 1 which is carried out at a temperature up to 75° C.

13. A process according to claim 1 in which the contact time is in the range of 10 seconds to 10 minutes.

14. A process according to claim 1 in which the material adhered to the microroughened surface is a polymeric material.

15. A process according to claim 1 which is for forming a multi-layer PCB comprising an inner-layer and an outer-layer, the inner-layer comprising at least one insulating layer and at least one conducting layer and the outer-layer comprising at least an insulating layer, in which the metal surface which is treated is a conducting layer.

16. A process according to claim 15 further comprising placing a pre-preg layer directly adjacent to the conducting layer and the two layers adhered one another in the adhesion step, thereby forming a multi-layer PCB.

17. The process of claim 14 in which the polymeric material is subsequently adhered to the microroughened conversion coated surface with no steps between the microroughening step and the step of adhering the polymeric material.

18. The process of claim 14 in which the polymeric material is subsequently adhered to the micoroughened conversion coated surface with a single rinse and/or drying step.

19. The processss of claim 9, wherein a second electrically insulative substrate is bonded to said second side.

20. The process according to claim 2 wherein said metal is a drum side treated copper foil.

21. The process according to claim 5 in which the concentration of acid in the composition is in the range of 9 to 20%.

22. The process according to claim 1 in which the corrosion inhibitor is a benzotriazole.

23. The process according to claim 7 in which the corrosion inhibitor is present in the adhesion promotion composition in an amount of at least 0.0005% by weight and no greater than 10% by weight of the total weight of the adhesion promotion composition.

24. The process of claim 7 in which the corrosion inhibitor is present in the adhesion promotion composition in an amount of at least 0.1% and no greater than 5% by weight of the total weight of the adhesion composition.

25. The process of claim 24 in which the corrosion inhibitor is present in the adhesion promotion composition in an amount of at least 0.1% and no greater than 1% by weight of the total weight of the adhesion promotion composition.

26. The process according to claim 8 wherein the cationic surfactant is a quaternary ammonium surfactant.

27. The process according to claim 1 in which the surfactant is present in the composition in an amount of at least 0.5% by weight and no greater than 3% by weight.

28. The process according to claim 1 in which the surfactant is present in the composition in an amount of at least 0.5% by weight and no greater than 2.5% by weight.

29. The process according to claim 1 which is carried out at a temperature in the range of 15° to 35° C.

30. The process according to claim 1 which is carried out at a temperature in the range of 20° to 30° C.

31. The process according to claim 1 in which the contact time is in the range of 30 seconds to 2 minutes.

32. A process according to claim 26 in which the quaternary ammonium surfactant is an ethoxylated fatty amine selected from the group consisting of isodecyloxypropyl dihydroxyethyl methyl ammonium chloride and isotridecyloxypropyl dihydroxyethyl methyl ammonium chloride.

* * * * *